United States Patent
Kim et al.

(10) Patent No.: US 7,649,380 B2
(45) Date of Patent: Jan. 19, 2010

(54) LOGIC CIRCUITS WITH ELECTRIC FIELD RELAXATION TRANSISTORS AND SEMICONDUCTOR DEVICES HAVING THE SAME

(75) Inventors: Chan-Young Kim, Seoul (KR); Jun-Hee Lim, Seoul (KR); Doo-Young Kim, Seongnam-si (KR); Jun-Hyung Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/902,263

(22) Filed: Sep. 20, 2007

(65) Prior Publication Data

US 2008/0129340 A1    Jun. 5, 2008

(30) Foreign Application Priority Data

Dec. 4, 2006    (KR) ...................... 10-2006-0121571

(51) Int. Cl.
*H03K 17/16* (2006.01)
*H03K 19/003* (2006.01)
*H03K 19/20* (2006.01)

(52) U.S. Cl. .......................... 326/26; 326/121; 327/108
(58) Field of Classification Search ........................ None
See application file for complete search history.

(56) References Cited

U.S. PATENT DOCUMENTS 6,028,814 A * 2/2000 Lim ...................... 365/230.06
6,031,388 A * 2/2000 Dobbelaere .................. 326/17
6,453,301 B1 * 9/2002 Niwa ........................... 705/26
6,459,301 B2 10/2002 Hidaka
6,617,902 B2 * 9/2003 Tokumasu et al. .......... 327/211
7,205,810 B1 * 4/2007 Lee et al. .................... 327/231

FOREIGN PATENT DOCUMENTS

| EP | 0520560 | 12/1992 |
| JP | 08-306799 | 11/1996 |
| JP | 10-242434 | 9/1998 |
| JP | 10-256549 | 9/1998 |
| JP | 2002-074950 | 3/2002 |
| JP | 2003-084846 | 3/2003 |
| KR | 1993-0001503 | 1/1993 |
| KR | 10-1998-0071634 | 10/1998 |

* cited by examiner

*Primary Examiner*—Rexford N Barnie
*Assistant Examiner*—Dylan White
(74) *Attorney, Agent, or Firm*—Harness, Dickey & Pierce, P.L.C.

(57) ABSTRACT

In a logic circuit, a first switching device is connected between a first voltage and an output terminal through which an output signal is output. The switching device is selectively activated and deactivated based on an input signal. A second switching device is connected to a ground voltage and is selectively activated and deactivated based on the input signal. A control circuit outputs a control signal in response to the input signal. The control signal has a first voltage level during a first time period in which a state of the input signal changes, and has a second voltage level during a second time period in which a state of the input signal is constant. The second voltage level is lower than the first voltage level. A field relaxation circuit is connected between the terminal through which the output signal is output.

20 Claims, 5 Drawing Sheets

LOGIC CIRCUITS WITH ELECTRIC FIELD RELAXATION TRANSISTORS AND SEMICONDUCTOR DEVICES HAVING THE SAME

PRIORITY STATEMENT

This non-provisional patent application claims priority under 35 U.S.C. § 119 to Korean Patent Application No. 2006-121571, filed on Dec. 4, 2006 in the Korean Intellectual Property Office (KIPO), the entire contents of which is hereby incorporated herein by reference.

BACKGROUND

Description of the Related Art

As gate length decreases, proportions of conventional semiconductor devices that are defective may increase due to hot carrier effects. Hot carrier effects may result from a relatively strong electric field in a drain region. Conventionally, methods for reducing voltage levels, increasing a gate length and/or reducing an impurity density of a drain region may be used to suppress such hot carrier effects. These methods, however, may degrade circuit performance. Alternatively, a field relaxation transistor may be inserted to suppress hot carrier effects.

FIG. 1 is a circuit diagram illustrating a logic circuit including a conventional field relaxation transistor. Referring to FIG. 1, a signal path 20 represents a path through which an input signal IN may pass until being input to the logic circuit 10. The signal path 20 may be configured in various ways depending on a type of the input signal IN or a semiconductor device in which the logic circuit 10 is employed. The conventional logic circuit 10 may include a PMOS transistor P1 connected between a terminal to which a voltage (e.g., a relatively high voltage) Vpp is applied and an output terminal. The PMOS transistor P1 may have a gate to which the input signal IN may be input through the signal path 20. The conventional logic circuit 10 may further include an NMOS transistor N1 connected to a ground voltage. The NMOS transistor N1 may have a gate to which the input signal IN may be input through the signal path 20. The logic circuit 10 may further include an NMOS transistor N2 connected between the output terminal and the NMOS transistor N1. The NMOS transistor N2 may have a gate to which the voltage Vpp may be applied.

The logic circuit 10 may invert the input signal IN input through the signal path 20 to output an output signal OUT. For example, when the input signal IN has a low logic level, the PMOS transistor P1 may be activated or turned on, and the NMOS transistor N1 may be deactivated or turned off, so that the output signal OUT of the high voltage Vpp level is output. When the input signal IN has a high logic level, the PMOS transistor P1 may be deactivated, and the NMOS transistor N1 may be activated, so that the output signal OUT of the ground voltage level may be output. A drain voltage of the NMOS transistor N1 may be reduced by a threshold voltage of the NMOS transistor N2, thereby reducing hot carrier effects.

The logic circuit of FIG. 1 may insert the NMOS transistor N2 between the PMOS transistor P1 and the NMOS transistor N1 as the field relaxation transistor to reduce the drain voltage of the NMOS transistor N1, thereby reducing hot carrier effects.

FIG. 2 is a cross-sectional view illustrating a configuration of the conventional logic circuit of FIG. 1. In FIG. 2, "A", "B" and "C" denote gates of the PMOS transistor 1 and the NMOS transistors, respectively, "D" denotes a drain region of the NMOS transistor N1, and "STI" denotes a shallow trench isolation for component isolation.

As shown in FIG. 2, the conventional logic circuit may continuously apply the voltage Vpp to the gate B of the NMOS transistor N2. If the input signal IN having a high logic level is applied, a signal of a high logic level is applied to the gate C of the NMOS transistor N1, so that the NMOS transistor N1 is activated and a voltage of the drain region D of the NMOS transistor N1 becomes a ground voltage level. At this time, because the voltage Vpp is applied to the gate B of the NMOS transistor N2, a leakage current 1 may occur due to tunneling, so that the NMOS transistor N2 may deteriorate, causing a circuit malfunction. If the input signal IN having a low logic level is applied, a signal of a low logic level is applied to the gate A of the PMOS transistor P1, so that the PMOS transistor P1 is activated, and the voltage Vpp is applied to the gate B of the NMOS transistor N2, so that the NMOS transistor N2 is activated. Thus, a voltage of the drain region D of the NMOS transistor N1 becomes a voltage level close to the voltage Vpp level. As a result, hot carriers may be generated in the drain region D of the NMOS transistor N1 due to a gate-induced drain leakage (GIDL) or impact ionization. The hot carriers may be accelerated by the voltage Vpp applied to the gate B of the NMOS transistor N2 to induce a gate leakage current 2, so that the NMOS transistor N2 may deteriorate, causing a circuit malfunction.

As described above, in the conventional logic circuit, the voltage Vpp may be continuously applied to the gate B of the NMOS transistor N2, causing deterioration of the NMOS transistor N2 and/or a circuit malfunction.

SUMMARY

Example embodiments relate to logic circuits, for example, logic circuits with field relaxation transistors (FRTS) in which deterioration of the field relaxation transistor is suppressed and semiconductor devices having the same.

At least one example embodiment provides a logic circuit. The logic circuit may include a first transistor, a second transistor, a control circuit and/or a field relaxation transistor. The first transistor may be connected between a first voltage and an output terminal through which an output signal is output. The first transistor may have a gate to which an input signal is input. The second transistor may be connected to a ground voltage and may have a gate to which the input signal is applied. The control circuit may output a control signal in response to the input signal. The control signal may have a first voltage level during a first time period in which a state of the input signal changes, and may have a second voltage level lower than the first voltage level during a second period in which a state of the input signal is constant. The field relaxation transistor may be connected between the output terminal and the second transistor. The control signal may be applied to a gate of the field relaxation transistor.

According to at least some example embodiments, the second voltage may be an external power voltage, and the first voltage may be a relatively high voltage obtained by boosting the external power voltage. The control circuit may include a detecting circuit configured to detect a rising edge of the input signal to output a pulse signal having a first width, and an output circuit configured to change a level of the control signal in response to the pulse signal and output the result. The first transistor may be a PMOS transistor, and the second transistor and the field relaxation transistor may be NMOS transistors.

At least one other example embodiment provides a semiconductor device. According to at least this example embodiment, the semiconductor device may include a voltage generating circuit and a logic circuit. The voltage generating circuit may be configured to boost an external power voltage to generate a relatively high voltage. The logic circuit may include a first transistor, a second transistor, a control circuit and/or a field relaxation transistor. The first transistor may be connected between a first voltage and an output terminal through which an output signal is output. The first transistor may have a gate to which an input signal is input. The second transistor may be connected to a ground voltage and may have a gate to which the input signal is applied. The control circuit may output a control signal in response to the input signal. The control signal may have a first voltage level during a first time period in which a state of the input signal changes, and may have a second voltage level lower than the first voltage level during a second period in which a state of the input signal is constant. The field relaxation transistor may be connected between the output terminal and the second transistor. The control signal may be applied to a gate of the field relaxation transistor.

According to at least some example embodiments, the first transistor may be a PMOS transistor. The second transistor and the field relaxation transistor may be NMOS transistors. The control circuit may include a detecting circuit configured to detect a rising edge of the input signal to output a pulse signal having a first width; and an output circuit configured to change a level of the control signal in response to the pulse signal and output the result.

BRIEF DESCRIPTION OF THE DRAWINGS

Example embodiments will become more apparent to those of ordinary skill in the art by describing in detail the example embodiments shown in the attached drawings in which.

DETAILED DESCRIPTION OF EXAMPLE EMBODIMENTS

Figure 1:
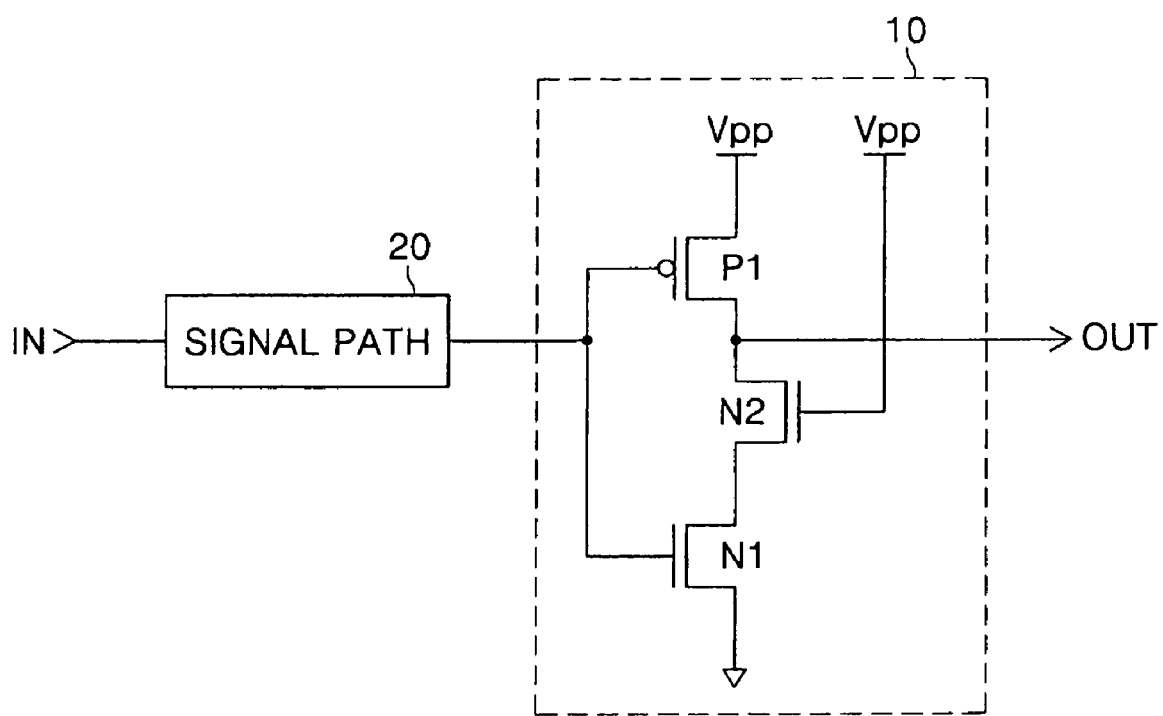
FIG. 1 is a circuit diagram illustrating a conventional logic circuit with a conventional field relaxation transistor.
Figure 2:
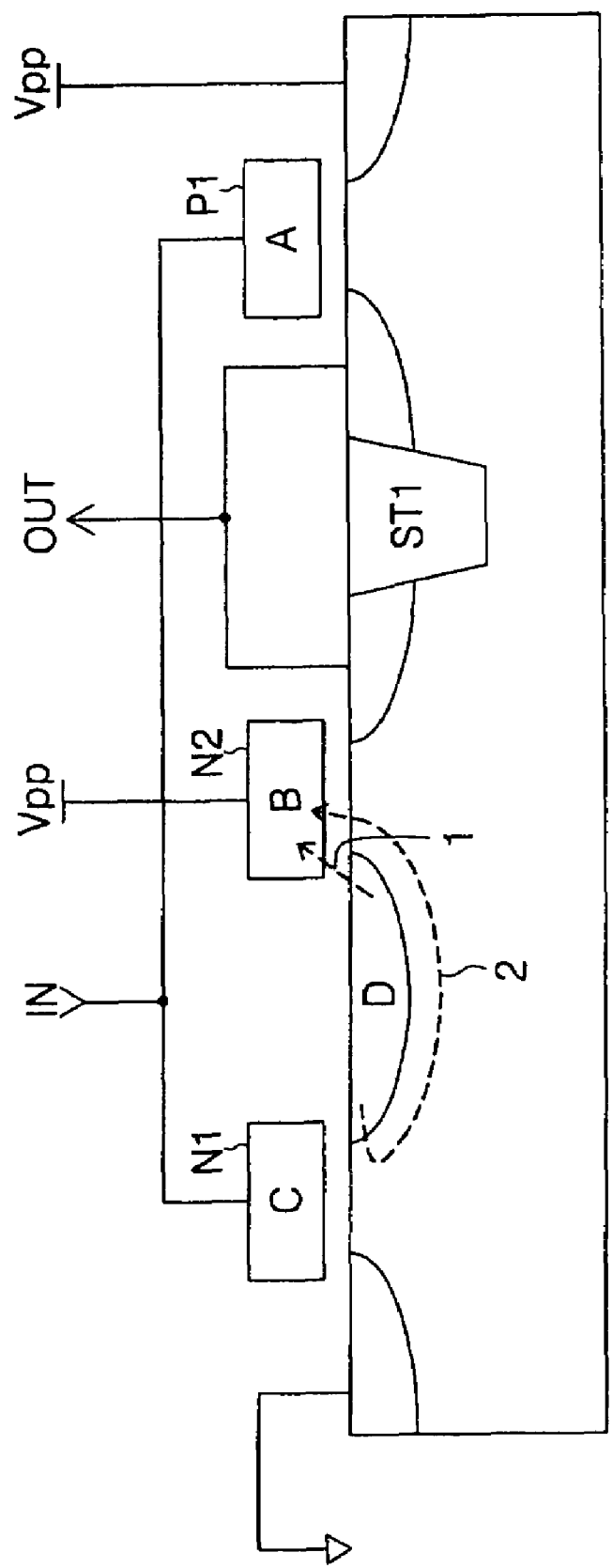
FIG. 2 is a cross-sectional view illustrating a configuration of the conventional logic circuit of FIG. 1.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred t6 as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 3:
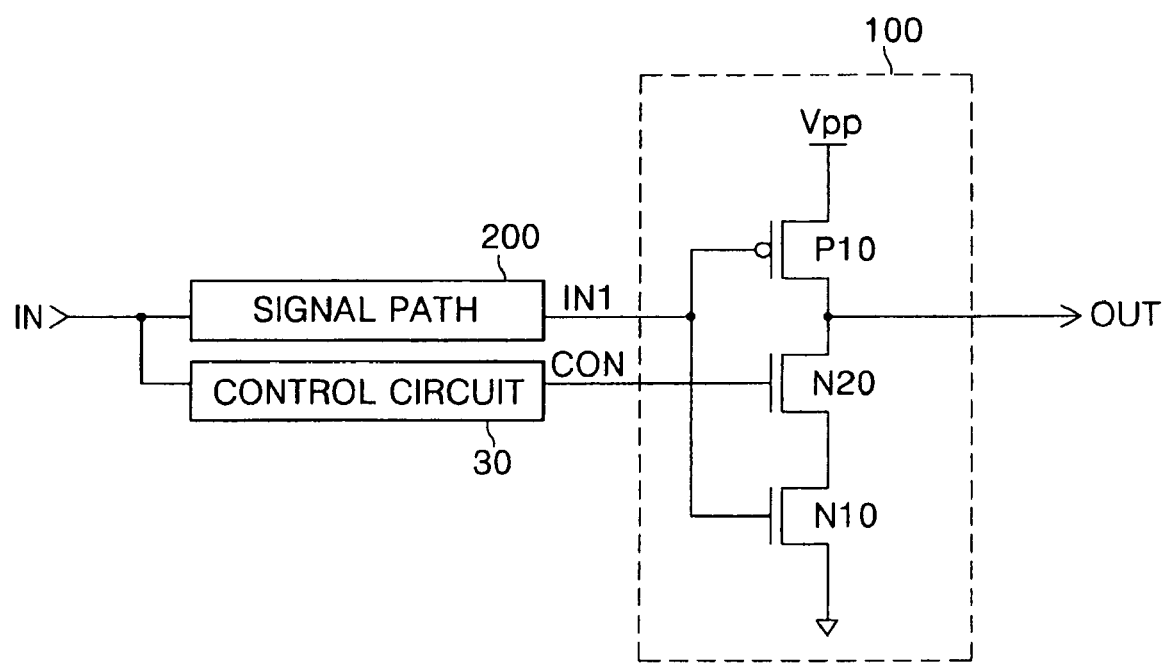
FIG. 3 is a circuit diagram illustrating a logic circuit with a field relaxation transistor according to an example embodiment.

FIG. 3 is a circuit diagram illustrating a logic circuit with a field relaxation transistor according to an example embodiment. For example purposes, the logic circuit of FIG. 3 represents an inverter. A logic circuit 100 and a control circuit 30 are shown.

Referring to FIG. 3, the logic circuit 100 may include a plurality of transistors. For example, the logic circuit 100 may include a transistor (e.g., a PMOS transistor) P10, a transistor (e.g., an NMOS transistor) N10 and/or a transistor (e.g., NMOS transistor) N20. The transistor P10 may be connected to a terminal to which a relatively high voltage Vpp may be applied and an output terminal through which an output signal OUT may be output. The transistor P10 may have a gate to which an input signal IN may be input through a signal path 200.

The transistor (e.g., an NMOS transistor) N10 may be connected to a ground voltage. A gate of the transistor N10 may receive the input signal IN input through the signal path 200. The transistor N20 may be connected between the output terminal and the transistor N10. A control signal CON output from the control circuit 30 may be applied to a gate of the transistor N20. In FIG. 3, the signal path 200 represents a path through which the input signal IN may pass until being input to the logic circuit 100 in a semiconductor device.

The logic circuit 100 may invert the input signal IN input through the signal path 200 to generate and output the output signal OUT. The transistor N20 may reduce a drain voltage of the transistor N10 to reduce hot carrier effects. The control circuit 30 may output a control signal CON in response to the input signal IN. The control circuit 30 may detect a time period at which the input signal IN transitions to a high logic level and may output the control signal CON having a voltage Vpp only during that period. The control circuit 30 may output the control signal CON having a level (e.g., external power voltage level) lower than the voltage Vpp level during other tune periods.

The logic circuit with the field relaxation transistor of FIG. 3 may further include the control circuit 30 so that the voltage Vpp may not be continuously (e.g., may be selectively or intermittently) applied to the gate of the transistor N20 which functions as the field relaxation transistor, thereby suppressing deterioration of the transistor N20 and/or circuit malfunction.

Figure 4:
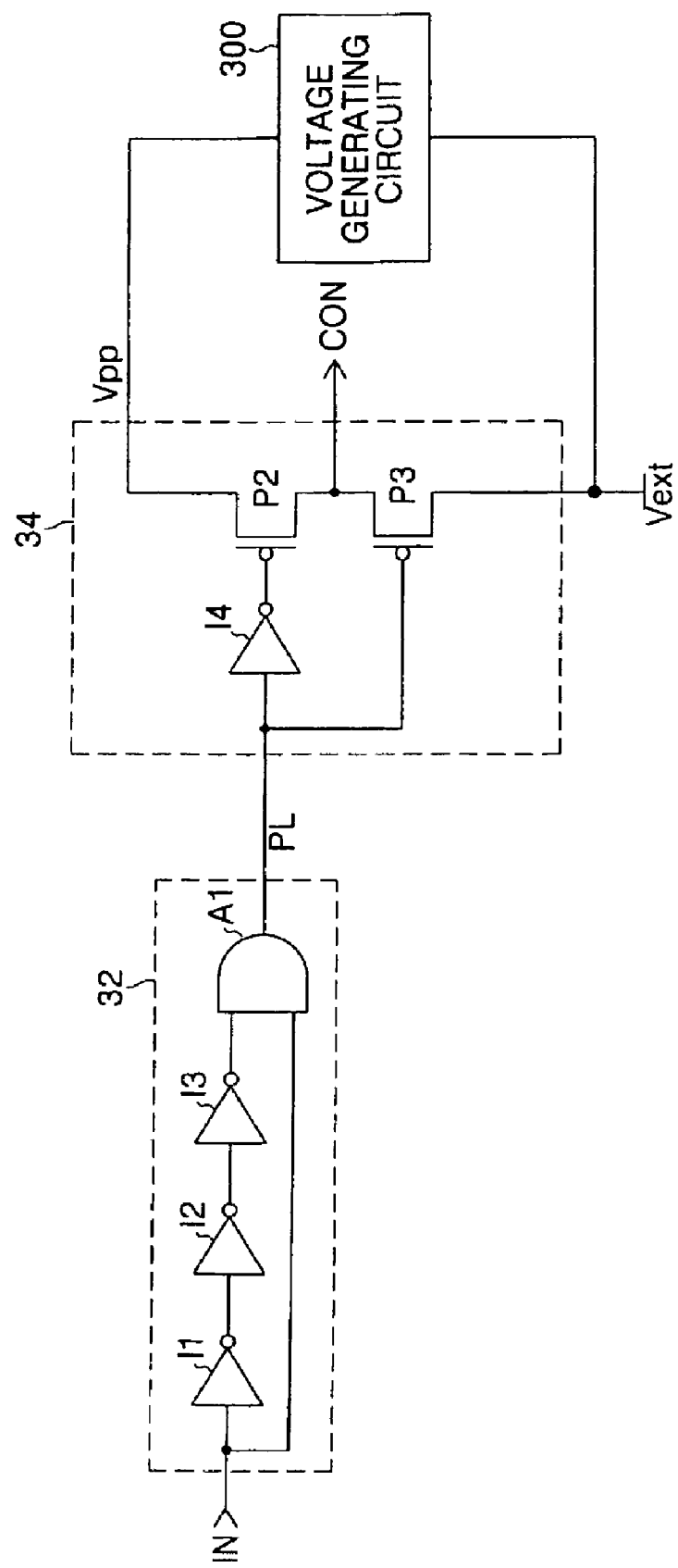
FIG. 4 is a circuit diagram illustrating a control circuit of a logic circuit with a field relaxation transistor according to an example embodiment.

FIG. 4 is a circuit diagram illustrating a control circuit, according to an example embodiment. The control circuit of FIG. 4 may be included as the control circuit 30 of the logic circuit with the field relaxation transistor as shown in FIG. 3.

Referring to FIG. 4, the control circuit may include a detecting circuit 32 and/or a signal generating circuit 34. The detecting circuit 32 may include a plurality of inverters I1 to I3 and/or a logic gate (e.g., an AND gate) A1. The signal generating circuit 34 may include a plurality of transistors (e.g., PMOS transistors) P2 and P3 and an inverter I4. The transistor P2 may be connected between a terminal to which the voltage Vpp is applied and a terminal through which the control signal CON is output. An inverted pulse signal PL may be applied to a gate of the transistor P2. The transistor P3 may be connected between an external power voltage Vext and the terminal through which the control signal CON is output. The pulse signal PL may be applied to a gate of the transistor P3.

The detecting circuit 32 may output the pulse signal PL in response to the input signal IN. For example, the detecting circuit 32 may detect a time period during which the input signal IN transitions from a low logic level to a high logic level to output the pulse signal PL having a first width. The signal generating circuit 34 may output the control signal CON in response to the pulse signal PL. For example, the signal generating circuit 34 may output a control signal having a voltage level according to a state of the pulse signal PL.

Figure 5:
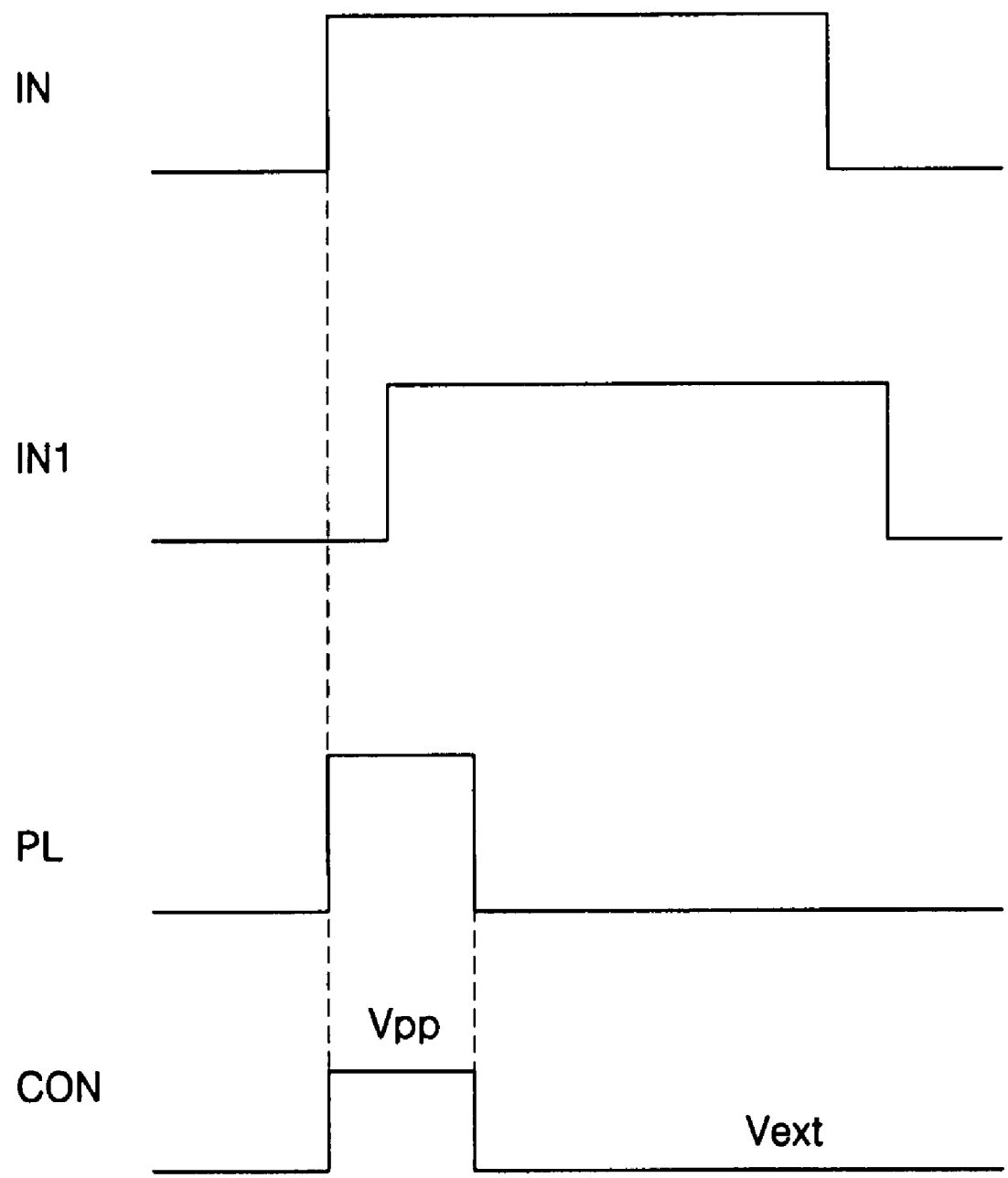
FIG. 5 is a view illustrating an example operation of a logic circuit with a field relaxation transistor according to an example embodiment.

FIG. 5 is a view illustrating an example operation of the logic circuit with the field relaxation transistor according to an example embodiment. In FIG. 5, "IN" denotes the input signal, "IN1" denotes a signal input to the gates of the PMOS and NMOS transistors P10 and N10, "PL" denotes the pulse signal output from the detecting circuit 32, and "CON" denotes the control signal output from the signal generating circuit 34.

Referring to FIG. 5, the input signal IN may be delayed through the signal path 200 and input to the logic circuit 100. The signal IN1 applied to the gates of the transistors P10 and N10 of the logic circuit 100 may be the input signal IN delayed for a first time period. The detecting circuit 32 may detect a rising edge (e.g., positive edge) of the input signal IN to output the pulse signal PL having a first width. The signal generating circuit 34 may output the control signal CON in response to the pulse signal PL. For example, if the pulse signal PL has a high logic level Vpp, the transistor P2 may be activated or turned on, and the transistor P3 may be deactivated or turned off, so that the control signal CON of the voltage Vpp level may be output. If the pulse signal PL has a low logic level, the transistor P2 may be deactivated, and the transistor P3 may be activated, so that the control signal CON having the external power voltage Vext level may be output.

Because logic circuits of semiconductor devices according to at least some example embodiments applies the voltage Vpp to the gate of the field relaxation transistor for a relatively short time according to a state of the input signal, deterioration of the field relaxation transistor FRT and/or the circuit malfunction resulting from tunneling may be suppressed.

According to at least some example embodiments, during a period in which the input signal IN transitions to a high logic level, the control signal CON of the external power voltage Vext level may be applied to the gate of the transistor N20. But, logic circuits according to at least some example embodiments may be configured such that the control signal CON having a lower level than the voltage Vpp may be applied to the gate of the transistor N20 to suppress deterioration of the transistor N20.

FIGS. 3 to 5 have been described with regard to an inverter for example purposes, however, example embodiments may be applied to other logic circuits (e.g., NAND circuits, NOR circuits, etc.).

For example, example embodiments may be applied to logic circuits employed in semiconductor devices using an external power voltage Vext and a relatively high voltage Vpp obtained by boosting the external power voltage Vext. As an example, FIG. 4 illustrates voltage generating circuit 300 boosting external power voltage Vext to generate the relatively high voltage Vpp.

As described above, logic circuits with the field relaxation transistors according to at least some example embodiments may apply the voltage Vpp to the gate of the field relaxation transistor during a relatively short time according to a state of the input signal, and may suppress and/or prevent deterioration of field relaxation transistors and/or circuit malfunction.

Example embodiments have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A logic circuit, comprising:
a first switching device connected between a first voltage and an output terminal through which an output signal is output, the first switching circuit being selectively activated and deactivated based on an input signal;
a second switching device connected to a ground voltage, the second switching device being selectively activated and deactivated based on the input signal;
a control circuit configured to output a control signal in response to the input signal, the control signal having a first voltage level during a first time period in which a state of the input signal changes from a first state to a second state, and having a second voltage level during a second time period exclusive of the first time period, the second voltage level being lower than the first voltage level; and
a field relaxation circuit connected between the output terminal and the second switching device, the field relaxation circuit being selectively activated and deactivated based on the control signal, wherein the control circuit includes
a detecting circuit configured to detect a rising edge of the input signal to output a pulse signal having a first width, the detecting circuit including
a logic gate configured to generate the pulse signal based on a first and a second input detection signal, and
an inverter circuit configured to generate the first input detection signal based on the second input detection signal; and
an output circuit configured to change a level of the control signal in response to the pulse signal and output the control signal.

2. The logic circuit of claim 1, wherein the first switching device is a transistor having a gate to which the input signal is applied.

3. The logic circuit of claim 2, wherein the transistor is a PMOS transistor.

4. The logic circuit of claim 1, wherein the second switching device is a transistor having a gate to which the input signal is applied.

5. The logic circuit of claim 4, wherein the transistor is an NMOS transistor.

6. The logic circuit of claim 1, wherein the field relaxation circuit is a transistor having a gate to which the control signal is applied.

7. The logic circuit of claim 6, wherein the transistor is an NMOS transistor.

8. The logic circuit of claim 1, wherein the second voltage level is an external power voltage, and the first voltage level is a voltage obtained by boosting the external power voltage.

9. The logic circuit of claim 1, wherein the output circuit includes,
an inverter configured to generate an inverted pulse signal by inverting the pulse signal, and
a first transistor being selectively activated and deactivated based on the inverted pulse signal, and
a second transistor being selectively activated and deactivated based on the pulse signal, wherein
the control signal is output at a first or a second voltage level based on the selective activation and deactivation of the first and second transistors.

10. A semiconductor device, comprising:
a voltage generating circuit for boosting an external power voltage to generate a first voltage; and
a logic circuit, wherein the logic circuit includes
a first switching device connected between the first voltage and an output terminal through which an output signal is output, the first switching circuit being selectively activated and deactivated based on an input signal;
a second switching device connected to a ground voltage, the second switching device being selectively activated and deactivated based on the input signal;
a control circuit configured to output a control signal in response to the input signal, the control signal having a first voltage level during a first time period in which a state of the input signal changes from a first state to a second state, and having a second voltage level during a second time period exclusive of the first time period, the second voltage level being lower than the first voltage level; and
a field relaxation circuit connected between the output terminal and the second switching device, the field relaxation circuit being selectively activated and deactivated based on the control signal.

11. The semiconductor device of claim 10, wherein the first switching device is a transistor having a gate to which the input signal is applied.

12. The semiconductor device of claim 11, wherein the transistor is a PMOS transistor.

13. The semiconductor device of claim 10, wherein the second switching device is a transistor having a gate to which the input signal is applied.

14. The semiconductor device of claim 13, wherein the transistor is an NMOS transistor.

15. The semiconductor device of claim 10, wherein the field relaxation circuit is a transistor having a gate to which the control signal is applied.

16. The semiconductor device of claim 15, wherein the transistor is an NMOS transistor.

17. The semiconductor device of claim 10, wherein the control circuit includes,
a detecting circuit configured to detect a rising edge of the input signal to output a pulse signal having a first width, and
an output circuit configured to change a level of the control signal in response to the pulse signal and output the control signal.

18. The semiconductor device of claim 17, wherein the detecting circuit includes,
a logic gate configured to generate the pulse signal based on a first and a second input detection signal, and an inverter circuit configured to generate the first input detection signal based on the second input detection signal.

19. The semiconductor device of claim 17, wherein the output circuit includes,
- an inverter configured to generate an inverted pulse signal by inverting the pulse signal, and
- a first transistor being selectively activated and deactivated based on the inverted pulse signal, and
- a second transistor being selectively activated and deactivated based on the pulse signal, wherein
  - the control signal is output at a first or a second voltage level based on the selective activation and deactivation of the first and second transistors.

20. A logic circuit, comprising:
- a first switching device connected between a first voltage and an output terminal through which an output signal is output, the first switching circuit being selectively activated and deactivated based on an input signal;
- a second switching device connected to a ground voltage, the second switching device being selectively activated and deactivated based on the input signal;
- a control circuit configured to output a control signal in response to the input signal, the control signal having a first voltage level during a first time period in which a state of the input signal changes from a first state to a second state, and having a second voltage level during a second time period exclusive of the first time period, the second voltage level being lower than the first voltage level; and
- a field relaxation circuit connected between the output terminal and the second switching device, the field relaxation circuit being selectively activated and deactivated based on the control signal, wherein the control circuit includes
  - a detecting circuit configured to detect a rising edge of the input signal to output a pulse signal having a first width, and
  - an output circuit configured to change a level of the control signal in response to the pulse signal and output the control signal, the output circuit including,
    - an inverter configured to generate an inverted pulse signal by inverting the pulse signal,
    - a first transistor being selectively activated and deactivated based on the inverted pulse signal, and
    - a second transistor being selectively activated and deactivated based on the pulse signal, wherein
      - the control signal is output at a first or a second voltage level based on the selective activation and deactivation of the first and second transistors.

* * * * *